United States Patent [19]
Arimoto

[11] Patent Number: 5,313,484
[45] Date of Patent: May 17, 1994

[54] QUANTUM BOX OR QUANTUM WIRE SEMICONDUCTOR STRUCTURE AND METHODS OF PRODUCING SAME

[75] Inventor: Hiroshi Arimoto, Kawasaki, Japan

[73] Assignee: Fujitsu Limited, Kawasaki, Japan

[21] Appl. No.: 898,541

[22] Filed: Jun. 15, 1992

[30] Foreign Application Priority Data

Jun. 13, 1991 [JP] Japan ................................ 3-141808

[51] Int. Cl.$^5$ .............................................. H01S 3/19
[52] U.S. Cl. ........................................ 372/46; 372/45; 372/50; 437/129
[58] Field of Search .................... 372/46, 50, 45; 437/129

[56] References Cited

U.S. PATENT DOCUMENTS 5,070,510  12/1991  Konushi et al. ..................... 372/46

FOREIGN PATENT DOCUMENTS 64-17487  1/1989  Japan .
0079489  3/1990  Japan ..................................... 372/46

OTHER PUBLICATIONS

T. Fukui et al., "GaAs Tetrahedral Quantum Dots: Towards a Zero-Dimensional Electron-Hole System", *Extended Abstracts of the 22nd* (1990 *International*) *Conference on Solid State Devices and Materials*, Sendai, 1990, pp. 99–102.

Masahiro Asada, "Regarding Possibility of Quantum Box Semiconductor Laser," Investigation on Electronic Study World (1988), pp. 69–78 (Asaki Shupan-sha).

Japanese Patent Application No. 3-159287 dated Jul. 9, 1991 with English language Abstract.

*Primary Examiner*—Georgia Y. Epps
*Attorney, Agent, or Firm*—Staas & Halsey

[57] ABSTRACT

A quantum box semiconductor structure in which truncated triangular, or quadrilateral, pyramid base portions are formed on the main surface of a silicon semiconductor substrate defined, selectively, by a (111) B or a (100) plane; the triangular, or quadrilateral, truncated pyramid base portions have corresponding three, or four, (111) A plane sides, respectively. Corresponding triangular, or quadrilateral, quantum boxes of a second semiconductor material having a narrower energy band gap and larger electron affinity than the first, silicon semiconductor material of the base portions are formed on the corresponding triangular, or quadrilateral, top surfaces of the base portions and each has three, or four, corresponding (111) A plane sides. The quantum box lasers are formed in a succession of process steps including epitaxial growth or, alternatively, alternate epitaxial growth and etching steps. An alternative structure includes stripe-like quantum boxes of triangular cross-section. Further, the quantum boxes may be truncated and further triangular, or quadrilateral, prisms may be formed on the corresponding top surfaces of the respective boxes. A further embodiment employs truncated base portions of triangular prism cross-section and quantum wires of triangular cross-section formed thereon. Covering, clad and electrode interconnection layers are formed on the resulting structures and the main surface of the substrate, with respective electrodes being formed on the electrode interconnection layer and the bottom main surface of the substrate.

24 Claims, 11 Drawing Sheets

QUANTUM BOX OR QUANTUM WIRE SEMICONDUCTOR STRUCTURE AND METHODS OF PRODUCING SAME

BACKGROUND OF THE INVENTION

1. Field of the Invention

The present invention relates to a semiconductor structure provided with quantum boxes or quantum wires therein and a method of producing the same.

The semiconductor structure according to the present invention is suitable for an optical semiconductor device having excellent performance and a semiconductor device operating at an ultra-high speed.

2. Description of the Related Art

In order to improve the performance of an optical apparatus and an electronic apparatus, such as an electronic computer, there is a demand for optical semiconductor devices and electrical semiconductor devices that have higher performance. A semiconductor quantum box or wire utilizing the quantum mechanical properties of electrons can provide a semiconductor device structure meeting the demand.

Such a semiconductor quantum box or wire would afford a lower threshold current of a semiconductor laser, improved performance of an optical nonlinear material, and larger integration, higher speed and more functional operation of a semiconductor integrated circuit. However, it is very difficult to produce a semiconductor structure including a plurality of quantum boxes or quantum wires, both easily and reliably.

Referring to FIG. 1, quantum boxes are formed on a semiconductor substrate 1. In this case, a semiconductor clad layer 2, a semiconductor thin (well) layer 3 for the quantum boxes, and a semiconductor clad layer 4 are epitaxially grown on the semiconductor substrate 1. Fine pattern masks 5 are formed by applying a resist layer on the clad layer 4, exposing it with a fine lithography (e.g., an electron beam lithography process and developing it. Then the layers 2, 3 and 4 are selectively etched by a suitable dry etching method to form the semiconductor quantum boxes 3, each sandwiched between respective clad layers 2 and 4. The quantum boxes 3 can have a diameter of from 10 to 20 nm, which is capable of three-dimensionally confining electrons to create a quantum mechanical effect.

Referring to FIG. 2, quantum boxes are formed on a semiconductor substrate 11 by using the crystallinity of a single crystal semiconductor. In this case, a $SiO_2$ layer 12 is formed on a GaAs substrate 11, and then is selectively etched to form triangle openings by a conventional lithography (e.g., an electron beam lithography) and a dry etching method. AlGaAs portions 13 are epitaxially grown on the GaAs substrate 11 through the openings by using an Al source, a Ga source and an As source, and then the Al source supply is stopped to successively epitaxially grow GaAs portions 14 on the AlGaAs portions 13, respectively, with the result that each of triangular pyramids consists of a truncated triangular pyramid base portion 13 and a triangular pyramid top portion (quantum box) 14. One of the base sides of the GaAs pyramid quantum box can be about 10 nm or less, which is capable of three-dimensionally confining electrons in the box to create a quantum mechanical effect.

Although the quantum boxes are formed simultaneously, the sizes of the boxes are different from each other (i.e., are not uniform) because of a low accuracy in the patterning processes (exposure, development and etching tolerances). For example, when the sizes of the triangle openings in the $SiO_2$ layer are not the same within the tolerance of lithography, the grown triangular pyramids have different heights, and thus the sizes of the triangular pyramid top portions (quantum boxes) are not the same among the boxes. Each of the quantum boxes has a peak density state $\rho(E)$ of electron energy level. Where the dimensions of the quantum boxes are almost the same, the respective energy levels of the quantum boxes have substantially the same value with the result that a peak is obtained in the distribution of the density of states, as shown in FIG. 3. On the other hand, when the dimensions of the boxes are not the same, the respective energy levels of the quantum boxes are distributed, as shown in FIG. 3, with the result that quantum mechanical effects are not effectively attained.

In the case of a quantum wire semiconductor structure, similar problems are caused by size fluctuations, or differences, in lithography.

SUMMARY OF THE INVENTION

An object of the present invention is to provide a method of easily producing a quantum box (or quantum wire) semiconductor structure including a plurality of quantum boxes of almost the same size.

Another object of the present invention is to provide a quantum box or quantum wire semiconductor structure having improved quantum mechanical effects.

Another object of the present invention is to provide quantum mechanical effect devices, such as a semiconductor quantum box (or wire) laser, an optical nonlinear material, and a high performance semiconductor device (integrated circuit).

The above-mentioned and other objects of the present invention are obtained by providing a method of producing a quantum box semiconductor structure comprising the steps of:

forming an insulating layer having equilateral triangle (or square) openings on a semiconductor substrate of a III-V compound semiconductor having a main (111) B plane (or of a silicon semiconductor having a main (100) plane);

growing triangular pyramids made of a first III-V compound semiconductor and having three (111) A plane sides (or quadrilateral pyramids made of a silicon semiconductor and having four (111) plane sides), on the exposed surfaces of the substrate through the openings;

etching the top portions of the pyramids to form truncated triangular (or quadrilateral) pyramid base portions; and growing triangular pyramid quantum boxes having three (111) A plane sides and made of a second III-V compound semiconductor (or quadrilateral pyramid quantum boxes having four (111) plane sides and made of another semiconductor) having a narrower energy band gap and a larger electron affinity than those of the first III-V compound (or silicon) semiconductor, on the equilateral triangle (or square) top surfaces of the truncated triangular (or quadrilateral) pyramid base portions.

The triangular pyramids can be obtained because the openings have a equilateral triangle shape, and the growth rate of III-V compound semiconductor on the (111) A plane is lower than on another plane. A sufficient growing time makes substantially complete triangular pyramids with a top of 1 nm or less. A size fluctuation of the openings, owing to lithography, creates a fluctuation of the triangular pyramid sizes. Namely, the grown pyramids have different heights within a tolerance depending on the size fluctuation of the openings. Nevertheless, the upper portions of the triangular pyramids have the same triangular pyramid shape.

Next, when the top portions of the pyramids are etched, the etching process is performed under conditions such that the etch rate on the (111) A plane is very slow. Under such a condition, the pyramids are etched from the top in a perpendicular direction to the (111) B plane of the substrate and the etched heights are almost the same and are determined in accordance with the etching time. Thus, the triangular pyramids are truncated, so that terraces having substantially the same equilateral triangle area appear on the respective top surfaces thereof. It is preferable to make each of the equal three sides 10 nm or less.

Thereafter, since the triangular pyramid quantum boxes are formed on the same size terraces (triangle top surfaces) of the truncated triangular pyramids, the obtained quantum boxes have almost the same sizes. Therefore, the quantum boxes have almost the same electron energy level, as shown in FIG. 3, and a semiconductor structure provided with the quantum boxes exhibits quantum effects.

Furthermore, after the growth of the triangular pyramid quantum boxes, it is possible to etch the top portions of the pyramid boxes under conditions such that the etch rate on the (111) A plane is also very slow. The pyramids are etched from the top in a perpendicular direction to the substrate and the resulting etched heights are almost the same and are determined in accordance with the etching time. Thus, the triangular pyramids are truncated, so that terraces, having the same equilateral triangle smaller than the above-mentioned terraces, appear at the top surfaces thereof. Then, triangular pyramid top portions of the first III-V compound semiconductor are formed (epitaxially grown) on the terraces of the quantum boxes. In this case, the quantum boxes take the shape of a common truncated triangular pyramid, and each of the boxes is sandwiched between the respective truncated triangular pyramids lying thereunder and the respective triangular pyramid top portion lying thereon.

Such a sandwiched quantum box structure can be formed by adopting a continuous epitaxial-growing process without the additional etching step. After the formation of equilateral triangle terraces, the second III-V compound semiconductor is epitaxially deposited in a shape of truncated triangular pyramids on the same size triangle terraces, and successively the first III-V compound semiconductor is epitaxially deposited in a shape of triangular pyramid top portions thereon. Since the terraces are the same and the growing of the first semiconductor is accurately controlled under suitable epitaxial growing conditions, the obtained truncated triangular pyramids (i.e., quantum boxes) have almost the same size and are sandwiched between the respective first III-V compound semiconductor truncated triangular pyramids and pyramid top portions.

It is also possible to form a multilayer structure box consisting of first compound semiconductor thin layers and second compound semiconductor thin layers alternately piled or stacked, on each other instead of the truncated triangular pyramid quantum box. Thus, multiple quantum boxes may be obtained.

In the case of a silicon semiconductor being used, the quadrilateral pyramids of silicon can be obtained because the openings have a square shape and the growth rate of silicon on the (111) plane is very slow. After the formation of the complete quadrilateral pyramids, the pyramids are etched from the top thereof under conditions such that the etch rate of the (111) plane is very slow, thereby to form square terraces having almost the same size on the respective top surfaces thereof. Then, since the triangular pyramid quantum boxes are formed on the same size terraces (square top surface) of the truncated quadrilateral pyramids, the quantum boxes have almost the same sizes. Therefore, the quantum boxes have almost the same electron energy level, as shown in FIG. 3, and a semiconductor structure provided with the quantum boxes exhibits quantum effects.

Preferably, another semiconductor for the quantum boxes is germanium (Ge) or germanium-silicon compound (GeSi) which has a narrower energy band gap and a larger electron affinity than those of the silicon semiconductor.

Furthermore, after the growth of the quadrilateral pyramid quantum boxes, it is possible to etch the top portions of the pyramid boxes under conditions such that the etch rate on the (111) plane is also very slow. The pyramids are etched from the top in a perpendicular direction to the substrate and the etched heights are almost the same and are determined in accordance with the etching time. Thus, the quadrilateral pyramids are truncated, so that terraces having the same square shape, but smaller than the above-mentioned terraces, appear on the respective top surfaces thereof. Then, quadrilateral pyramid top portions of the silicon semiconductor are formed (epitaxially grown) on the terraces of the quantum boxes. In this case, the quantum boxes take the shape of the same size truncated quadrilateral pyramid, and each of the boxes is sandwiched between the respective truncated pyramids lying thereunder and the quadrilateral pyramid top portions lying thereon.

Instead of the etching and growing steps for the sandwiched quantum box structure, it is possible to epitaxially grow the Ge (GeSi) layer in a shape of truncated quadrilateral pyramids on the same size square terraces and, successively, to epitaxially grow the silicon triangular pyramid top portions thereon. Since the terraces are the same and the growing of the Ge (GeSi) is accurately controlled under suitable epitaxial growing conditions, the obtained truncated quadrilateral pyramids (i.e., quantum boxes) have almost the same size and are sandwiched between the respective silicon truncated pyramids and pyramid top portions.

It is also possible to form a multilayer structure box consisting of the silicon semiconductor thin layers and the Ge (or GeSi) thin layers, alternately piled, or stacked, on each other instead of the truncated triangular pyramid quantum boxes. Thus, multiple quantum boxes may be obtained.

According to another embodiment of the present invention, a method of producing a quantum wire semiconductor structure comprises the steps of:

forming an insulating layer having stripe openings on a III-V compound semiconductor substrate having a main (100) plane;

growing triangular prisms made of a first III-V compound semiconductor and having two (111) A plane sides, on the exposed surfaces of the substrate through the stripe openings;

etching triangular prism top portions of the prism to form truncated triangular prism base portions; and growing triangular prism quantum wires having two (111) A plane sides and made of a second III-V compound semiconductor having a narrower energy band gap and a larger electron affinity than those of the first III-V compound semiconductor, on stripe top surfaces of the truncated triangular prism base portions.

The triangular prisms can be obtained, because the openings have a stripe (belt) shape, and the growth rate of the fist III-V compound semiconductor on the (111) A plane is lower relatively to that on another plane. A sufficient growing time makes substantially complete triangular prisms. A size fluctuation of the openings due to lithography causes a fluctuation of triangular prism sizes. Namely, the grown prisms have different heights within a tolerance depending on the size fluctuation of the openings. Nevertheless, the upper portions of the triangular prisms have the same triangular prism shape.

Next, when the top portions of the prisms are etched, the etching process is performed under conditions such that the etch rate on the (111) A plane is very slow. Under such conditions, the prisms are etched from the tops in a perpendicular direction to the (100) plane of the substrate and the etched heights are almost same and are determined in accordance with the etching time. Thus, the triangular prism are truncated, so that terraces having the same stripe shape appear on the respective top surfaces thereof. It is preferable to make the width of the belt shapes 10 nm or less.

Thereafter, since the triangular prism quantum wires are formed on the same size terraces (stripe top surfaces) of the truncated triangular prisms, the obtained quantum wires have almost the same size. Therefore, the quantum wires have almost the same electron energy level, and a semiconductor structure provided with the quantum wires exhibits excellent quantum effects.

Furthermore, after the growth of the triangular prism quantum wires, it is possible to etch the top portions of the prism wire under conditions such that the etch rate on the (111) A plane is also very slow. The prisms are etched from the top in a perpendicular direction to the substrate and the etched heights are almost the same in accordance with the etching time. Thus, the triangular prisms are truncated, so that, terraces having the strip width smaller than that of the above-mentioned terraces, appear on the top sur thereof. Then, triangular prism top portions of the first III-V compound semiconductor are formed (epitaxially grown) on the terraces of the quantum wires. In this case, the quantum wires take the same shape of a truncated triangular prism, and each of the wires is sandwiched between the respective truncated triangular prism lying thereunder and the triangular prism top portion lying thereon.

Such a sandwiched quantum box structure can be formed by adopting a continuous epitaxial-growing process without the additional etching step. After the formation of stripe terraces, the second III-V compound semiconductor is epitaxially deposited in the shape of truncated triangular prisms on the same size stripe terraces, and successively the first III-V compound semiconductor is epitaxially deposited in the shape of triangular prism top portions thereon. Since the terraces are the same size and the growing of the first semiconductor is accurately controlled under suitable epitaxial growing conditions, the obtained truncated triangular prisms (i.e., quantum boxes) have almost the same size and are sandwiched between the respective first III-V compound semiconductor truncated triangular prisms and prism top portions.

It is also possible to form a multilayer structure wire consisting of first compound semiconductor thin layers and second compound semiconductor thin layers alternately piled, or stacked on each other instead of the truncated triangular prism quantum wire. Thus, a multiple quantum wire structure may be obtained.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Referring to FIGS. 4a to 4e, a quantum box semiconductor structure of a III-V compound semiconductor system is produced in accordance with an embodiment of the present invention as follows.

Figure 1:
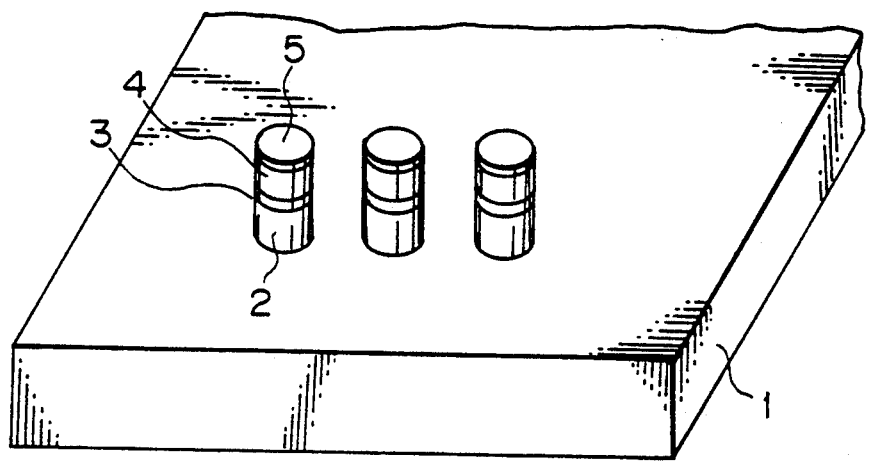
FIG. 1 is a schematic perspective view of conventional semiconductor quantum boxes formed on a substrate.
Figure 2:
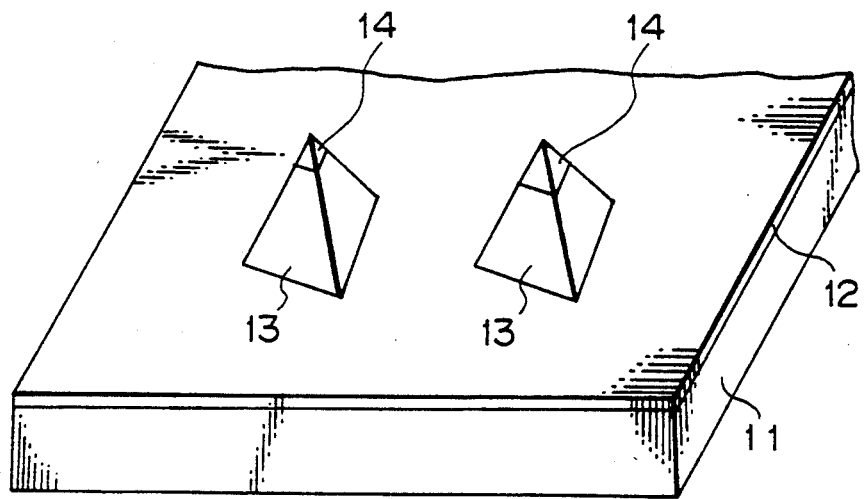
FIG. 2 is a schematic perspective view of other conventional semiconductor quantum boxes formed on a substrate.
Figure 3:
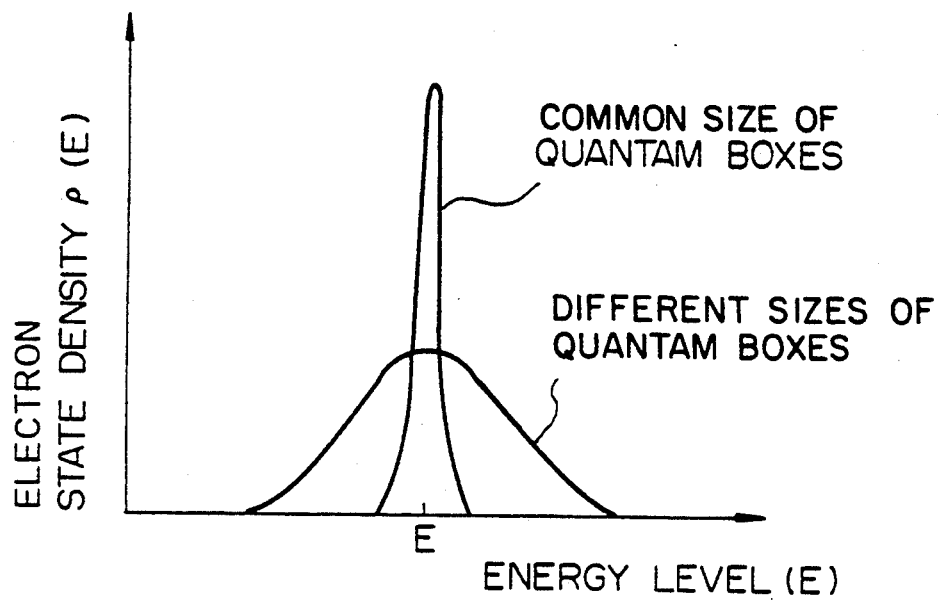
FIG. 3 is a graph showing the distribution of density of states for electron energy level.
Figure 4A:
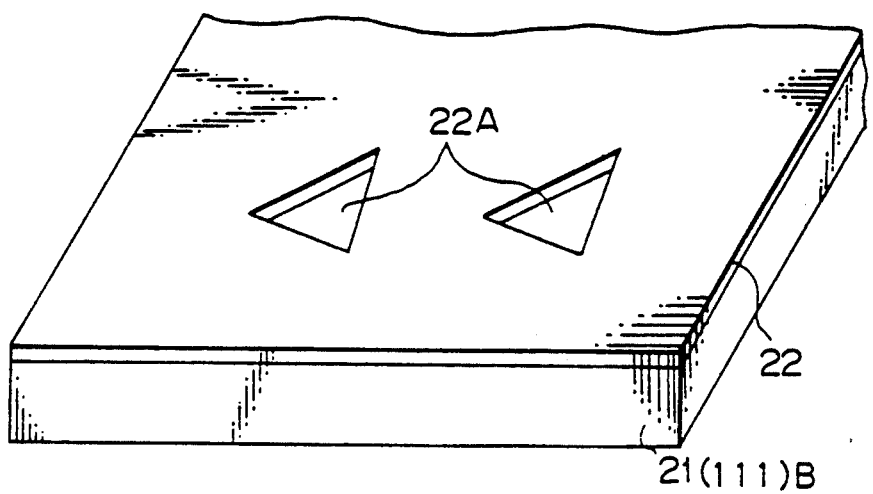
FIGS. 4a to 4e are schematic perspective views of a quantum box semiconductor structure of a III-V compound semiconductor system in various stages of production in accordance with an embodiment of the present invention.

As shown in FIG. 4a, an insulating layer (e.g., a $SiO_2$ layer) 22 is formed on a compound semiconductor (GaAs) substrate 21 having a (111) B plane by a chemical vapor deposition (CVD) process. The $SiO_2$ layer has a thickness of, e.g., 100 nm. Instead of the $SiO_2$ layer, a $Si_3N_4$ layer can be used. The insulating layer 22 is selectively etched by lithography (including a coating of a resist layer, an electron beam exposing (and developing) and by a reactive ion etching (RIE) process using an etching gas, such as $CF_4$ and $CHF_3$, to form a plurality of equilateral triangle openings 22A. Each of the triangle openings has a side length of, e.g., 0.5 μm. Portions of the substrate 21 are exposed through the openings 22A.

Figure 4B:
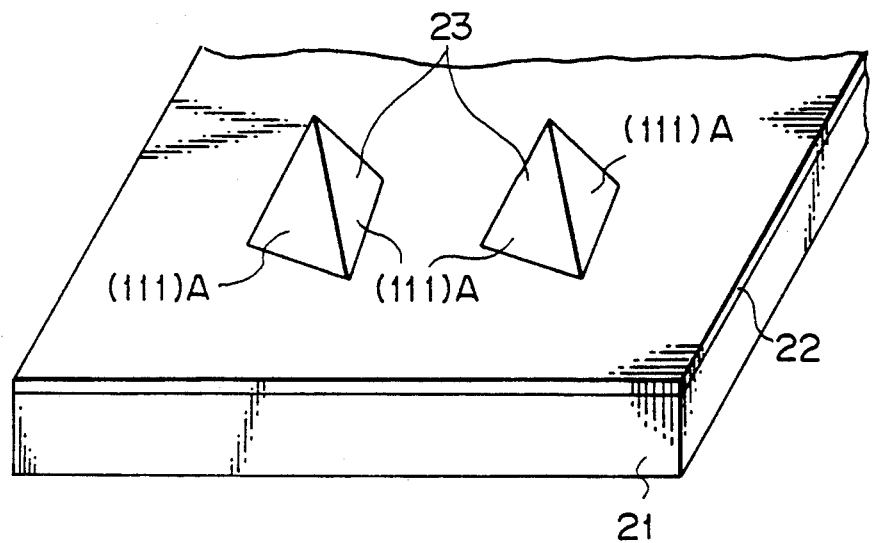

As shown in FIG. 4b, triangle pyramids 23 of AlGaAs (a first III-V compound semiconductor) are epitaxially grown on the exposed surfaces of the substrate 21 through the openings, respectively, by a metalorganic vapor phase epitaxy (MOVPE) process. To form complete triangular pyramids 23 having a bottom side length of 0.5 μm, the growth of $Al_{0.2}Ga_{0.8}As$ is performed under the following conditions.

| Substrate temperature: | 650–700° C. | |
|---|---|---|
| Source gases: | Triethyl gallium (TEG: | $Ga(C_2H_5)_3$ |
| | | 50 sccm |
| | Trimethyl aluminum (TMA: | $Al(CH_3)_3$ |
| | | 12.5 sccm |
| | Arsine $(AsH_3)$ | 480 sccm |
| Gas pressure: | 20 Torr | |
| Growth time: | 2 Hour | |

The thus produced triangular pyramids 23 of $Al_{0.2}Ga_{0.8}As$ have three side surfaces of (111) A plane and have a height of about 0.7 μm. In this case, it is necessary to allow time for completing the triangular pyramids. Owing to dimensional dispersion of the equilateral triangle openings, the sizes of the triangular pyramids differ and thus the heights of the pyramids are not uniform. Nevertheless, the upper portions of the pyramids are the same (uniform) within a range of 1 nm or less.

Figure 4C:
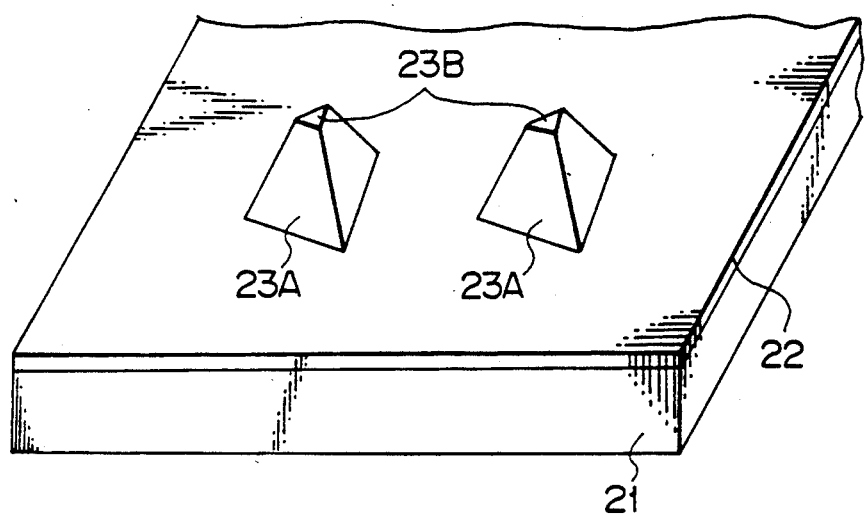

Next, the triangular pyramids 23 are etched from the top in a direction perpendicular to the (111) B plane of the substrate 21 at a predetermined etching time to form truncated triangular pyramids 23A having equilateral triangle top surfaces (terraces) 23B, as shown in FIG. 4c. When the etching is performed, it is necessary to lower the etch rate on the (111) A plane more than on other planes by one order of magnitude or more. The etching process is performed under the following conditions:

| Substrate temperature: | 40° C. |
|---|---|
| Etching gas: | $Cl_2$ |
| Gas pressure: | $1 \times 10^{-3}$ Torr |
| Etching time: | 40 minutes |

The etching proceeds uniformly, and etched heights are almost the same and are proportional to the etching time. The obtained equilateral triangle terraces 23B are the same size and have a one side length of 10 nm or less.

Figure 4D:
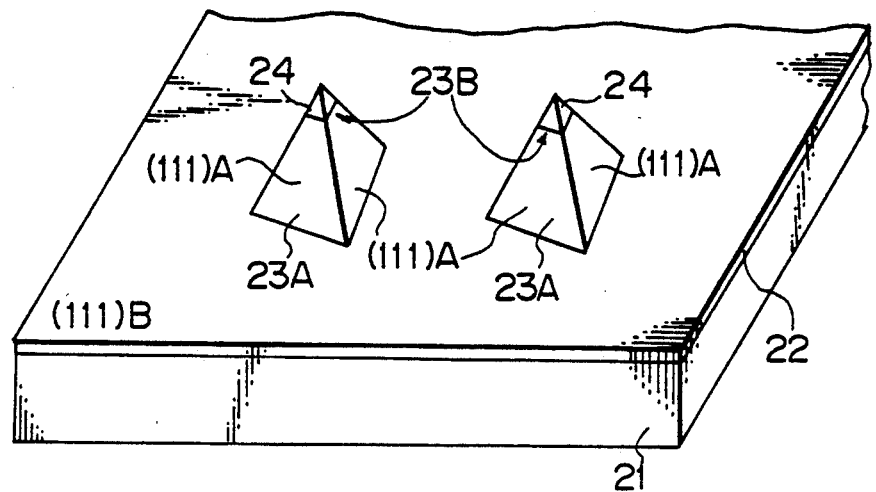

As shown in FIG. 4d, triangular pyramids (quantum boxes) 24 of GaAs are epitaxially grown on the terraces 23B, only, by an MOVPE process. To form complete triangular pyramids 24 having a bottom side length equal to the side length of the terraces 23B, the growth of GaAs is performed under the following conditions.

| Substrate temperature: | 650–700° C. | |
|---|---|---|
| Source gases: | Triethyl gallium (TEG: | $Ga(C_2H_5)_3$ |
| | | 50 sccm |
| | Arsine $(AsH_3)$ | 480 sccm |
| Gas pressure: | 20 Torr | |

| Growth time: | 2 minutes |
|---|---|
| | (for a growth of 50 nm) |

As the result, the obtained triangular pyramids 24 have three side surfaces of (111) A plane and have a height of about 14 nm.

Figure 4E:
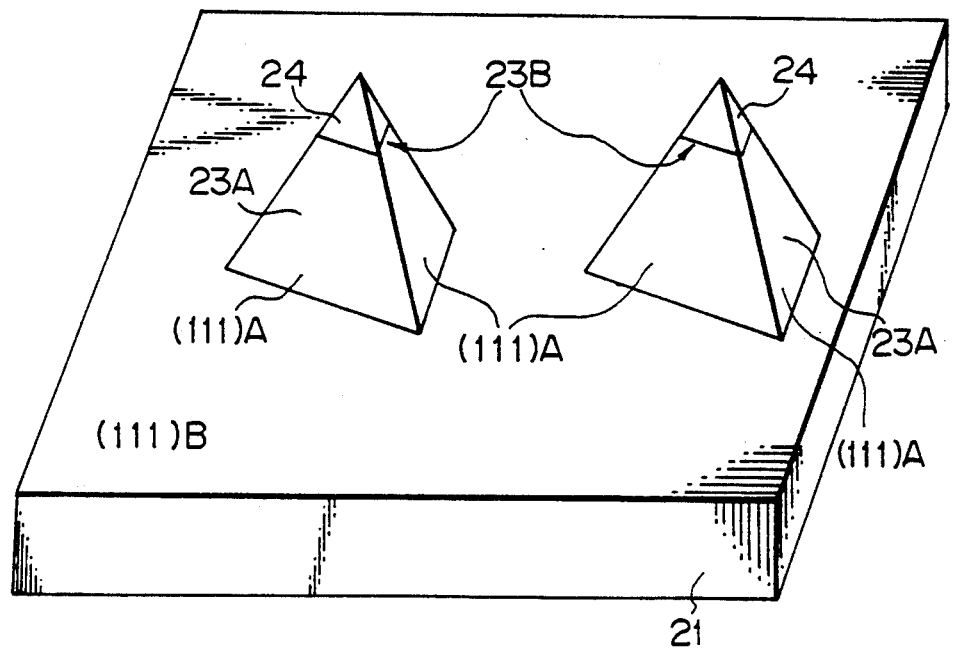

Then, the insulating layer 22 is removed by a wet etching process using a hydrogen fluoride (HF) solution, as shown in FIG. 4e. Accordingly, a quantum box semiconductor structure is obtained.

Figure 5:
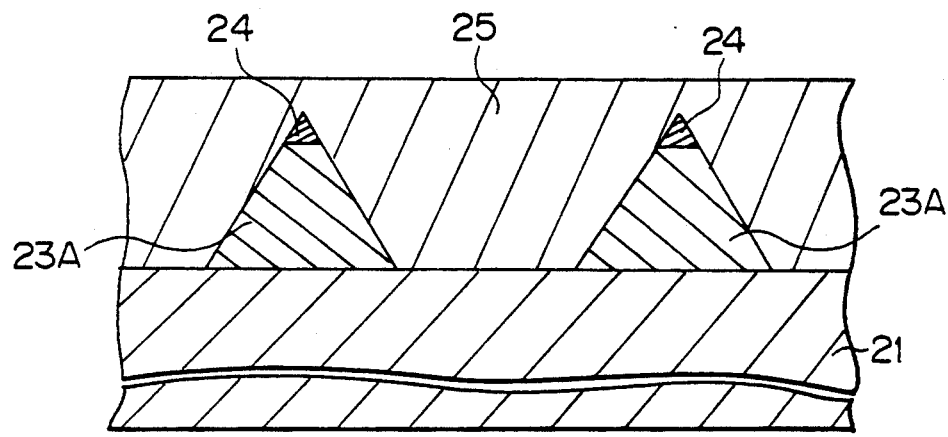
FIG. 5 is a schematic sectional view of an optical nonliner material provided with the quantum box semiconductor structure.

Thereafter, as shown in FIG. 5, an AlGaAs layer 25 is epitaxially grown on the substrate 21 and (111) A plane sides of the triangular pyramids. Such a whole growth of AlGaAs is performed under the following conditions.

| Substrate temperature: | 600–650° C. | |
|---|---|---|
| Source gases: | Triethyl gallium (TEG: | $Ga(C_2H_5)_3$ |
| | | 50 sccm |
| | Trimethyl aluminum (TMA: | $Al(CH_3)_3$ |
| | | 12.5 sccm |
| | Arsine $(AsH_3)$ | 1000 sccm |
| Gas pressure: | 40 Torr | |
| Growth time: | 1 Hour | |
| | (for a growth of about 1 μm) | |

The quantum boxes 24 of GaAs thus are completely embedded in the AlGaAs layer 25 and the AlGaAs truncated triangular pyramids 23A.

The obtained semiconductor element (FIG. 5) can be used as an optical nonlinear material. Such an optical element can operate to switch a light in a manner similar to that of an etalon type optical switching device utilizing a semiconductor multi quantum well. The optical element according to the present invention has a superior effect for confining exciton to that of the multi quantum well structure.

Figure 6:
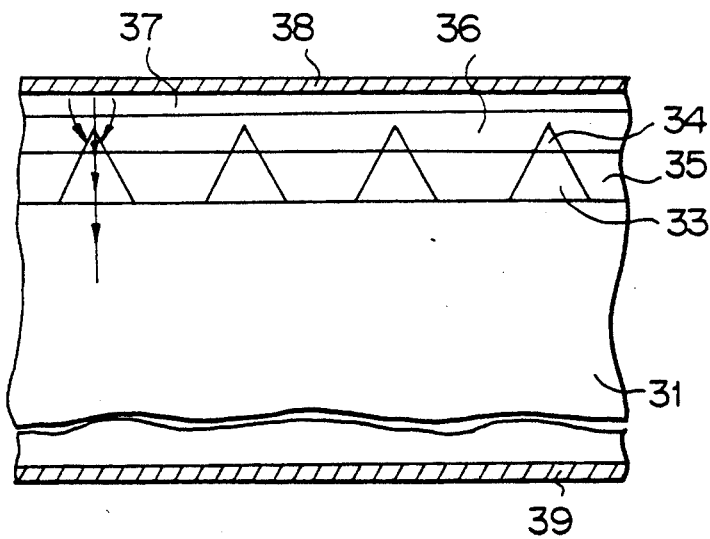
FIG. 6 is a schematic sectional view of a semiconductor quantum box laser.

Furthermore, as shown in FIG. 6, it is possible to produce a semiconductor quantum box laser by using the above-mentioned quantum box semiconductor structure. In FIG. 6, n-AlGaAs truncated triangular pyramids 33 are epitaxially formed on an n-GaAs substrate 31. Triangular pyramids (quantum boxes) 34 of undoped GaAs are epitaxially formed on triangle terraces of the truncated triangular pyramids 33. The substrate 31, truncated pyramids 33 and quantum boxes 34 correspond to the substrate 21, truncated pyramids 23 and quantum boxes 24 (FIG. 4e), respectively, and are formed in the above-mentioned manner.

Then, an undoped AlGaA burying layer 35 is formed on the substrate 31 and (111) A plane sides to a level which is above the triangle terraces and below the tops of the quantum boxes 34. A p-AlGaAs clad layer 36 is formed over the layer 35 and the quantum boxes 34. A p-GaAs cap (contact) layer 37 is formed on the layer 36. A p-side electrode 38 of AuZn is formed on the layer 37, and an n-side electrode 39 of AuGe is formed on the substrate 31. Then, the obtained structure is cleavaged at a light resonant length.

In the obtained semiconductor laser, electric current flows from the p-side electrode 38 to the n-side electrode 39 through the layers 37 and 36, the quantum boxes 34, the truncated triangular pyramids 33 and the substrate 31, as indicated with arrows in FIG. 6. Namely, the current flows in the quantum boxes 34 from the sides thereof and flows out of the boxes from the bottom planes thereof. A light is generated in each of the quantum boxes, the lights move back and forth between the cleavaged faces (mirrors), and a laser light is emitted at a light resonant state.

Figure 7:
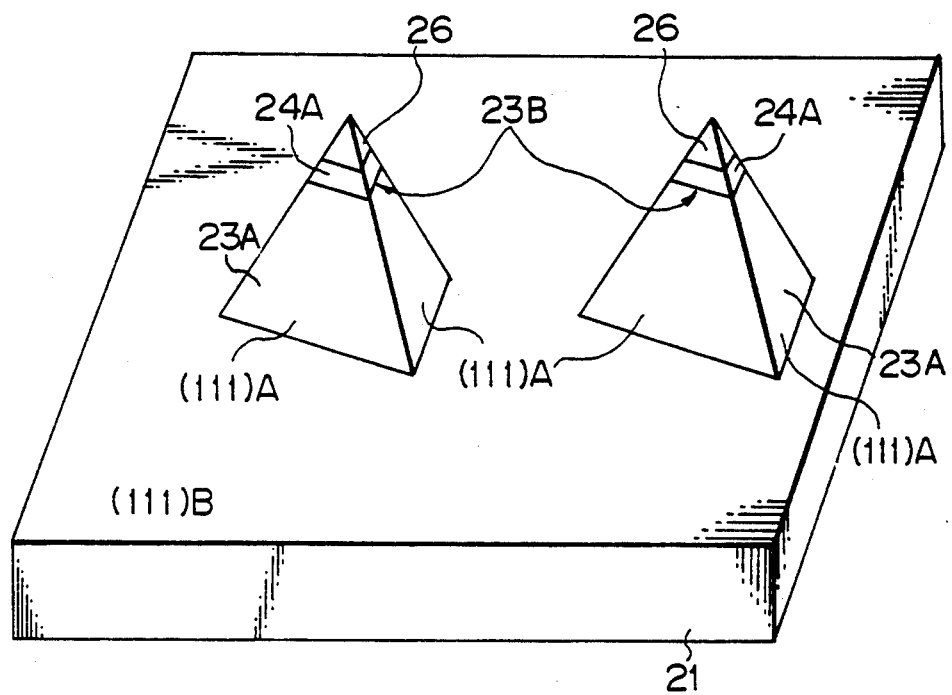
FIG. 7 is a schematic sectional view of a quantum box semiconductor structure including truncated pyramid quantum boxes.

According to another variation of the present invention, after the formation of the quantum boxes 24 (FIG. 4e), the triangular pyramid boxes are etched from the top thereof and define terraces 23B to truncate the top portions thereof. As the result, as shown in FIG. 7, truncated triangular pyramids (quantum boxes) 24A are formed and have equilateral triangle surfaces (terraces). Then, AlGaAs triangular pyramids 26 are epitaxially grown only on the terraces. In this case, the quantum boxes 24A are sandwiched between the truncated triangular pyramids 23 serving as a potential barrier of a quantum box and the triangular pyramids 26 serving as a potential barrier.

Such a sandwiched quantum box structure can be formed by adopting a continuous epitaxial-growing process without the additional etching step. After the formation of equilateral triangle terraces 23B (FIG. 4c), GaAs is epitaxially deposited on the terraces 23B for a predetermined time, only, by an MOVPE process to form truncated triangular pyramids 24A. Successively, AlGaAs is epitaxially deposited on the truncated pyramids 24A by adding an Al source in the MOVPE process thereby to form the triangular pyramids 26, as shown in FIG. 7.

Although the above-embodiments use a GaAs system among III-V compound semiconductor materials, it is possible to use an InP system.

Referring to FIGS. 8a to 8d, a quantum box semiconductor structure of a silicon semiconductor system is produced in accordance with another embodiment of the present invention as follows.

Figure 8A:
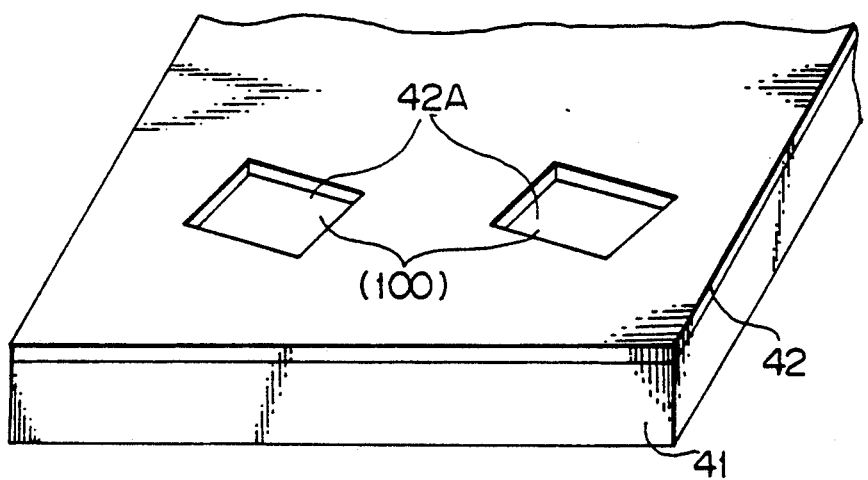
FIGS. 8a to 8d are schematic perspective views of a quantum box semiconductor structure of a silicon semiconductor system in various stages of production in accordance with another embodiment of the present invention.

As shown in FIG. 8a, an insulating layer 42 is formed on a silicon (Si) substrate 41 having a (100) plane by a chemical vapor deposition (CVD) process. The $SiO_2$ layer has a thickness of, e.g., 100 nm. Instead of the $SiO_2$ layer, a $Si_3N_4$ layer can be used. The insulating layer 42 is selectively etched by lithography (including a coating of a resist layer, an electron beam exposing, and developing) and by a reactive ion etching (RIE) process using an etching gas, such as $CF_4$ and $CHF_3$, to form a plurality of square openings 42A. Each of the square openings has a side length of, e.g., 1 μm. Portions of the substrate 21 are exposed through the openings 42A.

Figure 8B:
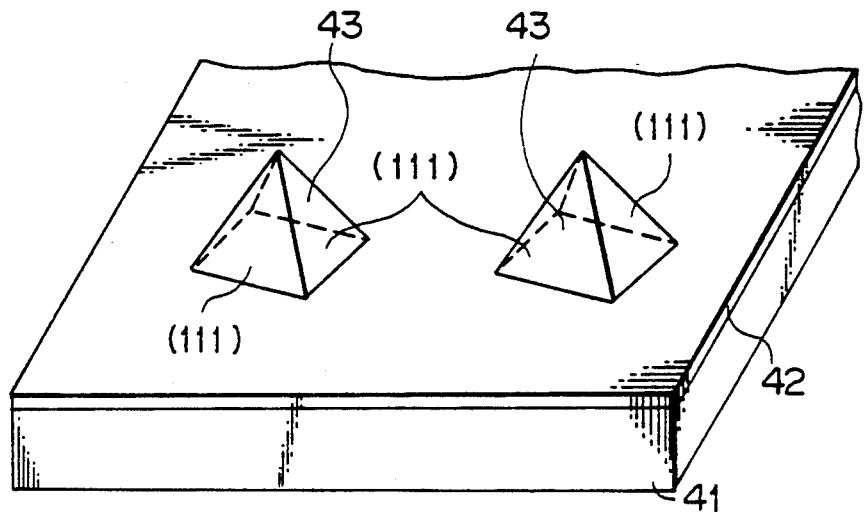

As shown in FIG. 8b, quadrilateral pyramids 43 of Si are epitaxially grown on the exposed surfaces of the substrate 41 through the openings 42A, respectively, by a chemical vapor deposition (CVD) process. The complete quadrilateral pyramids 43 have four side surfaces of (111) plane.

Figure 8C:
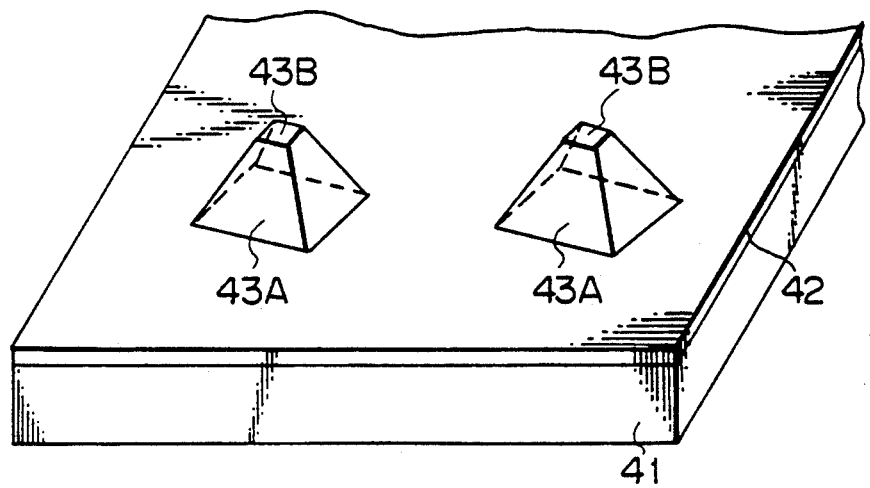

Next, the quadrilateral pyramids 43 are etched from the top in a direction perpendicular to the (100) plane of the substrate 41 at a predetermined etching time to form truncated quadrilateral pyramids 43A having square top surfaces (terraces) 43B, as shown in FIG. 8c. When the etching is performed, it is necessary to lower the etch rate on the (111) plane, relative to than on other planes, by one order of magnitude or more. The etching process (photochemical etching process) is performed under the following conditions:

| Light irradiation: | XeCl laser |
| Etching temperature: | Room temperature |

-continued

| Etching gas: | $Cl_2$ |
| Gas pressure: | 100 Torr |
| Etching time: | 1 minutes |

The etching proceeds uniformly, and etched heights are almost the same and are proportional to the etching time. The obtained square terraces 43B are the same size and have a one side length of 10 nm or less.

Figure 8D:
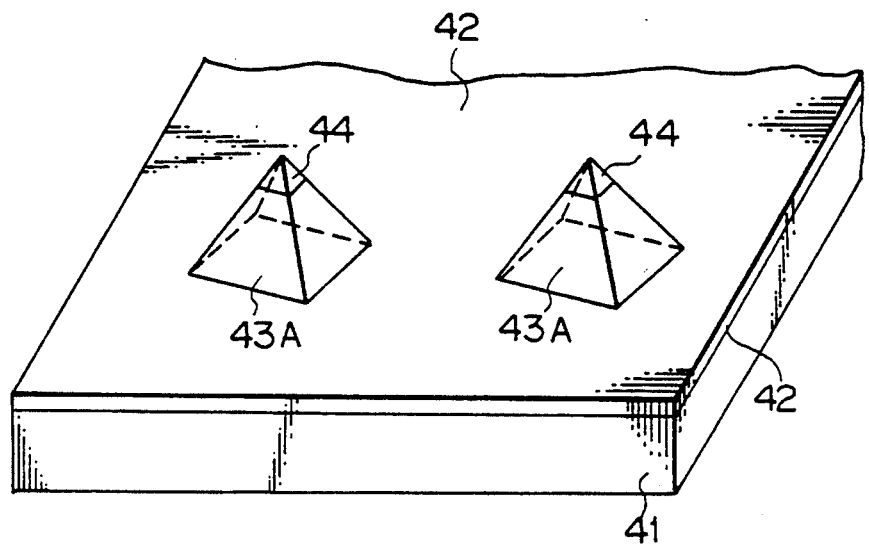

As shown in FIG. 8d, quadrilateral pyramids (quantum boxes) 44 of Ge are epitaxially grown on the terraces 43B, only, by a CVD process. The obtained complete quadrilateral pyramids 44 have four side surfaces of (111) plane and have a height of about 7 nm. Then, the insulating layer 42 is removed by a wet etching process using a hydrogen fluoride (HF) solution. Accordingly, a quantum box semiconductor structure of silicon system is obtained.

Figure 9:
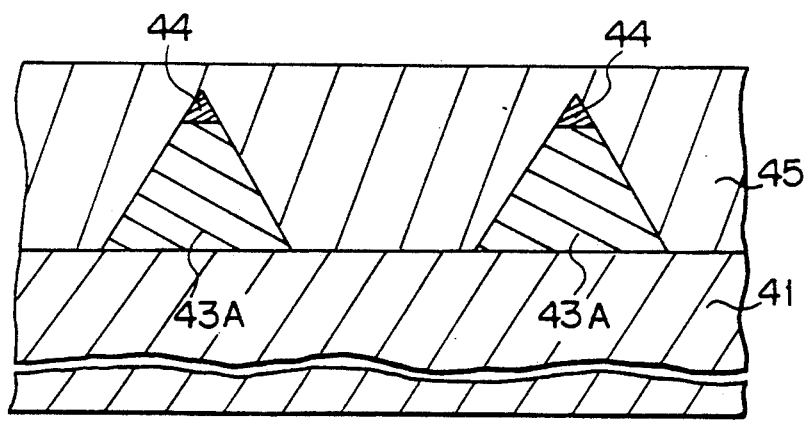
FIG. 9 is a schematic sectional view of a semiconductor device provided with the quantum box semiconductor structure.

Thereafter, as shown in FIG. 9, a Si layer 45 is epitaxially grown on the substrate 41 and (111) plane sides of the quadrilateral pyramids by adjusting suitable CVD conditions. As the result of the whole (i.e., uniform) growth of Si, the quantum boxes 44 of Ge are completely embedded in the Si layer 45 and the Si truncated quadrilateral pyramids 43A.

It is possible to use a germanium-silicon compound (GeSi) instead of Ge. Ge and GeSi have a narrower energy band gap and a larger electron affinity than those of Si.

It is also possible to use the obtained quantum box semiconductor structure in a semiconductor laser in a manner similar to that of the above-mentioned semiconductor laser shown in FIG. 6.

Figure 10:
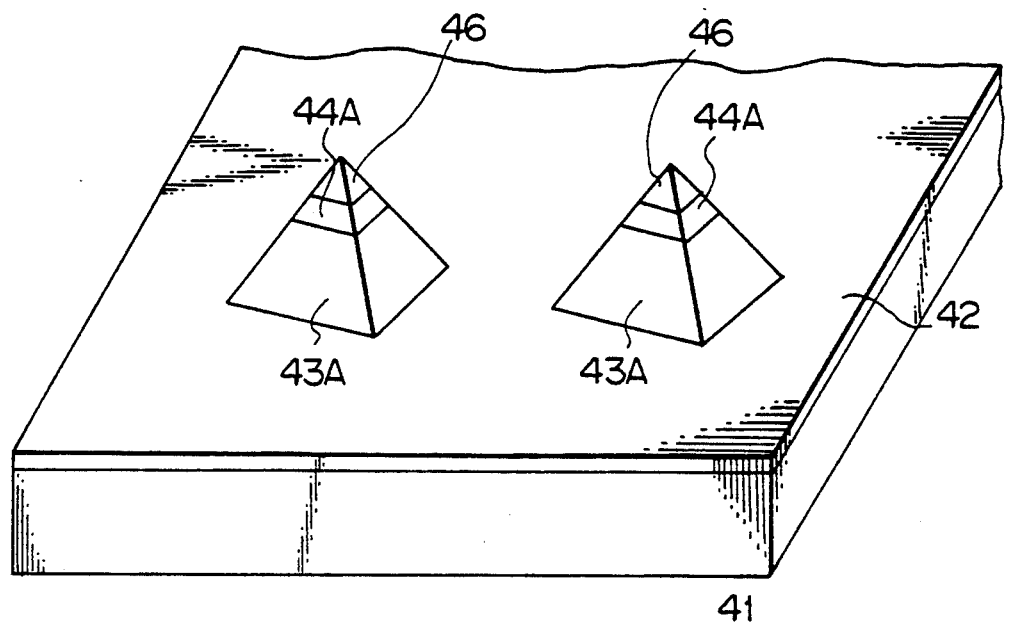
FIG. 10 is a schematic sectional view of a quantum box semiconductor structure including truncated pyramid quantum boxes.

Furthermore, after the formation of the quantum boxes 44 (FIG. 8d), the quadrilateral pyramid boxes are etched from the top thereof to truncate the top portions thereof. As the result, as shown in FIG. 10, truncated quadrilateral pyramids (quantum boxes) 44A are formed and have square top surfaces (terraces). Then, Si quadrilateral pyramids 46 are epitaxially grown, only, on the terraces. In this case, the quantum boxes 44A are sandwiched between the truncated quadrilateral pyramids 43, serving as a potential barrier, and the quadrilateral pyramids 46, serving as a potential barrier.

Such a sandwiched quantum box structure can be formed, alternatively, by adopting a continuous epitaxial-growing process without the additional etching step. After the formation of square terraces 43B (FIG. 8c), Ge is epitaxially deposited on the terraces 43B, only, for a predetermined time by an MOVPE process to form truncated quadrilateral pyramids 44A. Successively, Si is epitaxially deposited on the truncated pyramids 44A by changing the source material in the MOVPE process to form the quadrilateral pyramids 46, as shown in FIG. 10.

Figure 11A:
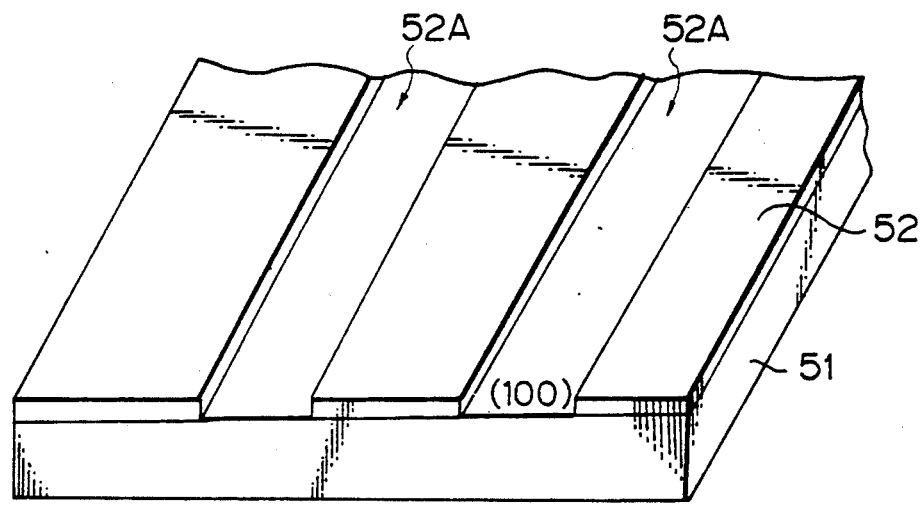
FIGS. 11a to 11c are schematic sectional views of a quantum wire semiconductor structure in various stages of production in accordance with another embodiment of the present invention.
Figure 11B:
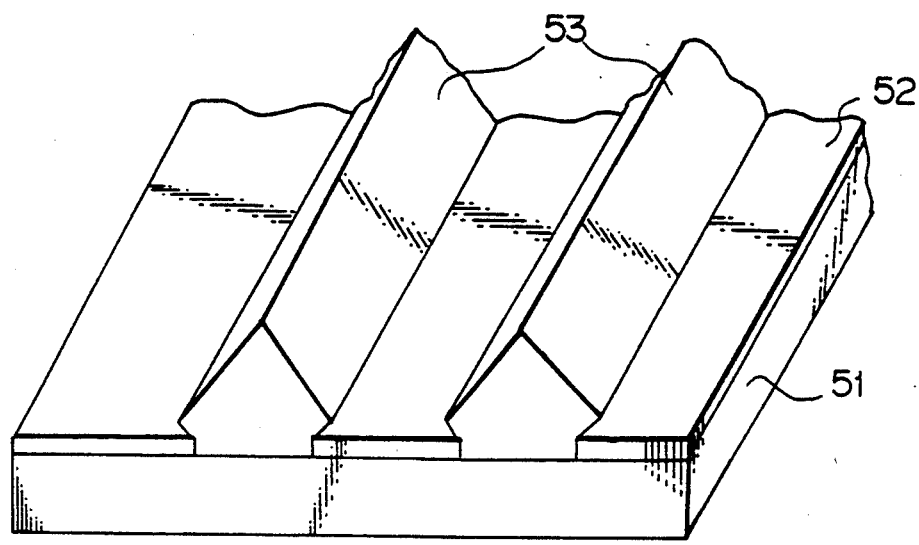
Figure 11C:
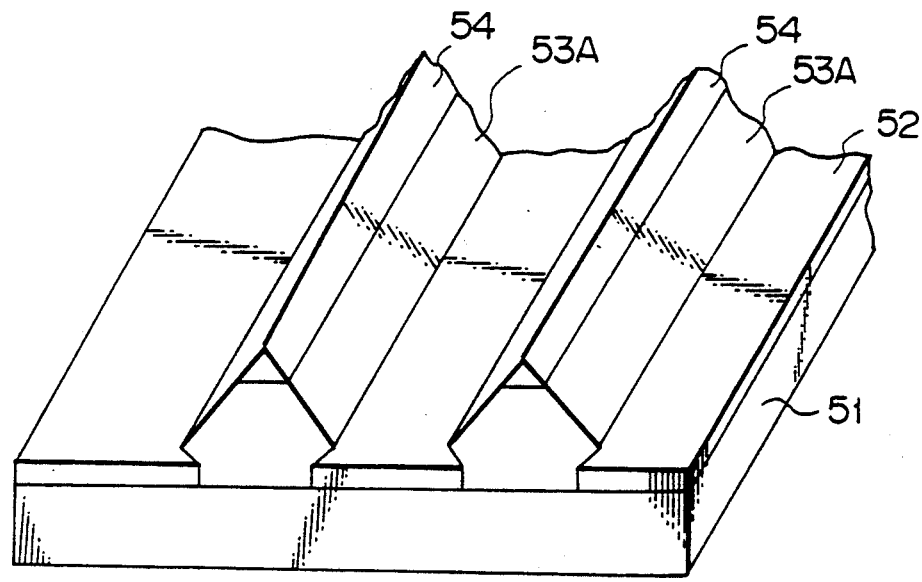

Referring to FIGS. 11a to 11c, a quantum wire semiconductor structure of a III-V compound semiconductor system is produced in accordance with still another embodiment of the present invention as follows.

As shown in FIG. 11a, an insulating layer (e.g., a $SiO_2$ layer) 52 is formed on a compound semiconductor (GaAs) substrate 51 having a (111) B plane by a CVD process. The $SiO_2$ layer has a thickness of, e.g., 100 nm. The insulating layer 52 is selectively etched by a lithography process (including a coating of a resist layer, an electron beam exposing, and developing) and by a RIE process using an etching gas, such as $CF_4$ and $CHF_3$, to form a plurality of stripe (belt) openings 52A. Each of the belt openings has a width of, e.g., 0.5 μm. Portions of the substrate 51 are exposed through the openings 52A.

As shown in FIG. 11b, triangular prisms 53 of AlGeAs (a first III-V compound semiconductor) are epitaxially grown on the exposed surfaces of the substrate 51 through the openings, respectively, by a MOVPE process. To form complete triangular prisms 53, the growth of $Al_{0.2}Ga_{0.8}As$ is performed under the following conditions.

| Substrate temperature: | 650–700° C. | |
|---|---|---|
| Source gases: | Triethyl gallium (TEG: | $Ga(C_2H_5)_3$) |
| | | 50 sccm |
| | Trimethyl aluminum (TMA: | $Al(CH_3)_3$) |
| | | 12.5 sccm |
| | Arsine ($AsH_3$) | 480 sccm |
| Gas pressure: | 20 Torr | |
| Growth time: | 2 Hour | |

As the result, the obtained triangular prisms 53 of $Al_{0.2}Ga_{0.8}As$ have two side surfaces of (111) A plane and have a height of, e.g., about 0.4 μm. In this case, it is necessary to allow time for completing the triangular prisms. Owing to dimensional dispersion of the belt openings, the size of the triangular prisms differ (scatter) and thus the heights of the prisms are not uniform. Nevertheless, the upper portions of the prisms are the same (uniform). In practice, each of the triangular prisms 53 has a special lower portion which widens at an initial growing stage, although such a widening mechanism is not elucidated.

Next, the triangular prisms 53 are etched from the tops in a direction perpendicular to the (111) B plane of the substrate 51 for a predetermined etching time to form truncated triangular prisms 53A having stripe top surfaces (terraces). When the etching is performed, it is necessary to lower the etch rate on the a (111) A plane, relatively to that on other planes by one order of magnitude or more. The etching process is performed under the following conditions;

| Substrate temperature: | 40° C. |
|---|---|
| Etching gas: | $Cl_2$ |
| Gas pressure: | $1 \times 10^{-3}$ Torr |
| etching time: | 40 minutes |

The etching proceeds uniformly, and etched heights are almost the same and are proportional to the etching time. The obtained belt terraces are the same size and have a width of 10 nm or less.

As shown in FIG. 11c, triangular prisms (quantum boxes) 54 of GaAs are epitaxially grown on the terraces, only, by an MOVPE process. To form complete triangular prisms 54 having a bottom side width equal to the terrace width, the growth of GaAs is performed under the following conditions.

| Substrate temperature: | 650° C. | |
|---|---|---|
| Source gases: | Triethyl gallium (TEG: | $Ga(C_2H_5)_3$) |
| | | 50 sccm |
| | Arsine ($AsH_3$) | 480 sccm |
| Gas pressure: | 20 Torr 20 Torr | |
| Growth time: | 2 minutes | |
| | (for a growth of 50 nm) | |

As the result, the obtained triangular prisms 54 have two side surfaces of (111) A plane and have a height of about 8 nm.

Then, the insulating layer 52 is removed by a wet etching process using a HF solution. Accordingly, a quantum wire semiconductor structure is obtained.

Figure 12:
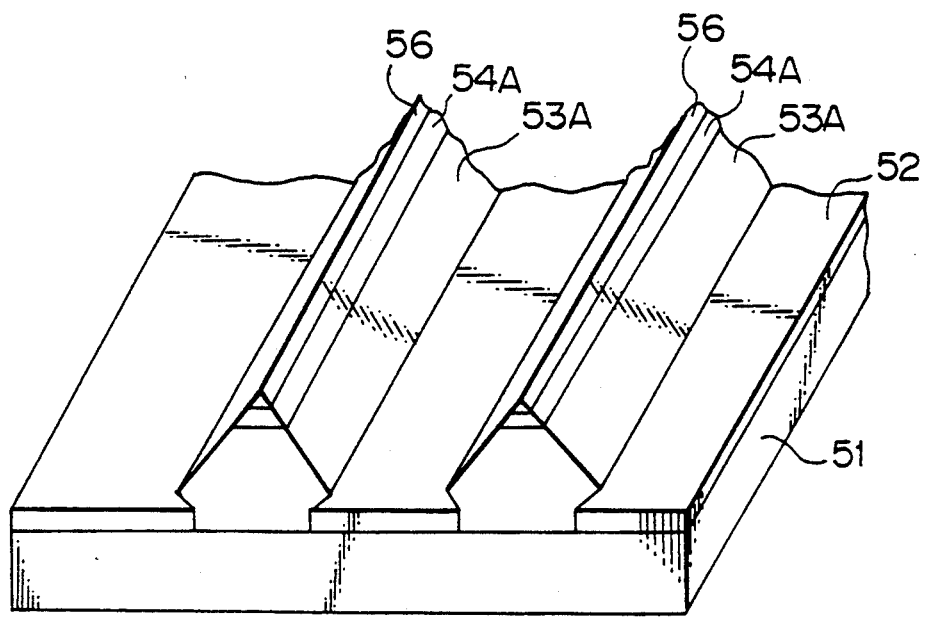
FIG. 12 is a schematic sectional view of a quantum wire semiconductor structure including truncated prism quantum boxes.

According to another variation of the present invention, after the formation of the quantum wires 54 (FIG. 11c), the triangular prism boxes are etched from the top thereof to truncate the top portions thereof. As a result, truncated triangular prisms (quantum boxes) 54A are formed and have stripe top surfaces (terraces). Then, as shown in FIG. 12, AlGaAs triangular prisms 56 are epitaxially grown, only, on the terraces. In this case, the quantum boxes 54A are sandwiched between the truncated triangular prisms 53 serving as a potential barrier, and the triangular prisms 56, serving as a potential barrier.

Such a sandwiched quantum box structure can be formed. Alternatively, by adopting a continuous epitaxial-growing process without the additional etching step. After the formation of belt terraces of the truncated triangular prisms 53A, GaAs is epitaxially deposited on the terraces, only, for a predetermined time by an MOVPE process thereby to form truncated triangular prisms 54A. Successively, AlGaAs is epitaxially deposited on the truncated prisms 54A by adding an Al source in the MOVPE process to form the triangular prisms 56, as shown in FIG. 12.

According to the present invention, the formed terraces of the truncated pyramids (or prisms) have the same size in spite of the scattering (i.e., differences) of the heights of the pyramids (or prisms), and the obtained quantum boxes (wires) of the pyramids (or prisms) have the same size with a high accuracy. Therefore, dimensional scattering of the quantum boxes (wires) can be reduced, so that the respective electron energy levels in the quantum boxes (wires) are constant, and thereby to achieve excellent quantum effects.

It will be obvious that the present invention is not restricted to the above-mentioned embodiments and that many variations are possible for persons skilled in the art without departing from the scope of the invention.

I claim:

1. A quantum box semiconductor structure comprising:
    a III-V compound semiconductor substrate having a main surface comprising the (111) B plane;
    truncated triangular pyramid base portions made of a first III-V compound semiconductor, each having a corresponding triangular top surface of a substantially common size and three (111) A sides, formed on the main surface of said substrate; and
    triangular pyramid quantum boxes respectively corresponding to and formed on the corresponding triangle top surfaces of said truncated triangular pyramid base portion, each thereof having three (111) A sides lying in corresponding, common planes with the three (111) A sides of the respective truncated triangular pyramid base portions, of a second III-V compound semiconductor having a narrower energy band gap and a larger electron affinity than the energy band gap and electron affinity of said first III-V compound semiconductor.

2. A quantum box semiconductor structure comprising:

a III-V compound semiconductor substrate having a main surface comprising the (111) B plane;

truncated triangular pyramid base portions made of a first III-V compound semiconductor formed on the main surface of said substrate, each having a corresponding triangular top surface of a substantially common size and three (111) A plane sides and serving as a potential barrier;

truncated triangular pyramid quantum boxes formed on the corresponding triangle top surfaces of said truncated triangular pyramids, each thereof having three (111) A plane sides lying in corresponding common planes with the three (111) A sides of the respective pyramid base portions, of a second III-V compound semiconductor having a narrower energy band gap and a larger electron affinity than the energy band gap and electron affinity of said first III-V compound semiconductor; and triangular pyramid top portions respectively corresponding to and formed on the corresponding triangle top surfaces of said truncated triangular pyramid quantum boxes and made of said first III-V compound semiconductor, each thereof having three (111) A sides lying in corresponding, common planes with the respective, common planar three (111) A sides of the respective truncated triangular pyramid quantum boxes and the truncated triangular pyramid base portions and serving as a potential barrier.

3. A method of producing a quantum box semiconductor structure comprising the steps of:

providing a III-V compound semiconductor substrate having a main surface comprising the (111) B plane;

forming an insulating layer on the main surface of the semiconductor substrate and having equilateral triangle openings therein exposing corresponding portions of the main surface of the semiconductor substrate;

growing triangular pyramids of a first III-V compound semiconductor each having three corresponding (111) A plane sides, on respective, surface portions of said main surface semiconductor substrate exposed through said equilateral triangle openings;

etching triangular pyramid top portions of said triangular pyramids thereby to form truncated triangular pyramid base portions having corresponding equilateral triangular top surfaces; and growing triangular pyramid quantum boxes on the corresponding equilateral triangle top surfaces of respective said truncated triangular pyramid base portions, each triangular pyramid quantum box having three corresponding (111) A plane sides lying in respective common planes with the corresponding three (111) A plane sides of the respective truncated triangular pyramid base portion, of a second III-V compound semiconductor having a narrower energy band gap and a larger electron affinity than the energy band gap and electron affinity of said first III-V compound semiconductor.

4. A method of producing a quantum box semiconductor structure comprising the steps of:

providing a III-V compound semiconductor substrate having a main surface comprising the (111) B plane;

forming an insulating layer on the main surface of the semiconductor substrate and having equilateral triangle openings therein exposing corresponding portions of the main surface of the semiconductor substrate;

growing triangular pyramids of a first III-V compound semiconductor, each having three corresponding (111) A plane sides, on respective surface portions of said main surface of said semiconductor substrate exposed through said equilateral triangle openings;

etching triangular pyramid top portions of said triangular pyramids thereby to form truncated triangular pyramid base portions, each having corresponding, first equilateral triangular top surfaces and serving as a potential barrier;

growing truncated triangular pyramid quantum boxes on the corresponding, first equilateral triangle top surfaces of respective said truncated triangular pyramid base portions, each triangular pyramid quantum box having three corresponding (111) A plane sides lying in respective common planes with the corresponding three (111) A plane sides of the respective truncated triangular pyramid base portions and a corresponding, second triangle top surface, of a second III-V compound semiconductor having a narrower energy band gap and a larger electron affinity than the energy band gap and electron affinity of said first III-V compound semiconductor; and growing triangular pyramid portions, each having three (111) plane A sides, made of said first III-V compound semiconductor and serving as a potential barrier, on the corresponding, second equilateral triangle top surfaces of said respective, truncated triangular pyramid quantum boxes.

5. A quantum box semiconductor structure comprising:

a silicon semiconductor substrate having a main (100) plane;

truncated quadrilateral pyramid base portions made of a first silicon semiconductor material, each having four corresponding (111) plane sides and a corresponding, square top surface, formed on said substrate; and quadrilateral pyramid quantum boxes formed on the corresponding square top surfaces of respective said truncated quadrilateral pyramid base portions, each quadrilateral pyramid quantum box having four corresponding (111) plane sides, of a second semiconductor material having a narrower energy band gap and a larger electron affinity than the energy band gap and electron affinity of said first silicon semiconductor material.

6. A quantum box semiconductor structure according to claim 5, wherein said corresponding square top surfaces of said base portions are of a substantially common size.

7. A quantum box semiconductor structure according to claim 5, wherein said second semiconductor material is selected from the group consisting of germanium and germaniumsilicon compound material.

8. A quantum box semiconductor structure comprising:

a silicon semiconductor substrate having a main gate (100) plane;

truncated quadrilateral pyramid base portions made of a first, silicon semiconductor material and formed on said substrate, each having four corresponding (111) plane sides and a corresponding, square top surface and serving as a potential barrier;

truncated quadrilateral pyramid quantum boxes formed on the corresponding square top surfaces of respective said truncated quadrilateral pyramid base portions, each truncated quadrilateral pyramid quantum box having four corresponding (111) sides and a corresponding square top surface smaller than the respective, corresponding square top surface of the respective said truncated quadrilateral pyramid base portion, of a second semiconductor material having a narrower energy band gap and a larger electron affinity than the energy band gap and electron affinity of said first, silicon semiconductor; and quadrilateral pyramid portions of said first, silicon semiconductor material formed on the corresponding square top surfaces of respective, said truncated quadrilateral pyramid quantum boxes, each quadrilateral pyramid portion having four corresponding (111) plane sides and serving as a potential barrier.

9. A quantum box semiconductor structure according to claim 8, wherein said corresponding square top surfaces of said base portions are of a substantially common, first size.

10. A quantum box semiconductor structure according to claim 8, wherein said second semiconductor material is selected from the group consisting of germanium and germaniumsilicon compound material.

11. A quantum box semiconductor structure according to claim 8, wherein said corresponding square top surfaces of said truncated quadrilateral pyramid quantum boxes are of a substantially common, second size which is smaller than the first size.

12. A method of producing a quantum box semiconductor structure comprising the steps of:

forming an insulating layer on a silicon semiconductor substrate having a main surface defined by the (100) plane, the insulating layer having square openings therein through which corresponding portions of the main surface of the substrate are exposed;

growing respective quadrilateral pyramids of a first, silicon semiconductor material, each having four (111) plane sides, on the surface portions or said main surface of said substrate exposed through said square openings;

etching quadrilateral pyramid top portions of said pyramids to form truncated quadrilateral pyramid base portions having corresponding, square top surfaces; and growing quadrilateral pyramid quantum boxes, each having four (111) A plane sides, of a second semiconductor material having a narrower energy band gap and a larger electron affinity than the energy band gap and electron affinity of said silicon semiconductor, on the corresponding square top surfaces of respective, said truncated quadrilateral pyramid base portions.

13. A method of producing a quantum box semiconductor structure comprising the steps of:

forming an insulating layer on a silicon semiconductor substrate having a main (100) plane, the insulating layer having square openings therein through which corresponding portions of the main surface of the substrate are exposed;

growing respective quadrilateral pyramids of a first, silicon semiconductor material, each having four (111) plane sides and a corresponding, first quadrilateral top surface, on the surface portions of said main surface of said substrate exposed through said square openings;

etching the quadrilateral pyramid top portions of said pyramids to form truncated quadrilateral pyramid base portions, each having a corresponding quadrilateral top surface and serving as a potential barrier;

growing truncated quadrilateral pyramid quantum boxes, each having four corresponding (111) plane sides and a corresponding, second quadrilateral top surface, smaller than the corresponding first quadrilateral top surface of the respective truncated quadrilateral pyramid base portion, of a second semiconductor material having a narrower energy band gap and a larger electron affinity than the energy band gap and electron affinity of said first, silicon semiconductor, on the corresponding, first quadrilateral top surfaces of respective said truncated quadrilateral pyramid base portions; and growing quadrilateral pyramid top portions of said first, silicon semiconductor material, each having four corresponding (111) plane sides and serving as a potential barrier, on the corresponding, first quadrilateral top surfaces of respective, said truncated quadrilateral pyramid quantum boxes.

14. A quantum wire semiconductor structure comprising:

a III-V compound semiconductor substrate having a main surface defined by the (100) plane;

truncated triangular prism base portions of a first III-V compound semiconductor material, each having two corresponding (111) A plane sides and a corresponding, truncated top portion, formed on said main surface of said substrate; and triangular prism quantum wires formed on the corresponding striped top surfaces of respective, said base portions, each having two corresponding (111) A plane sides, of a second III-V compound semiconductor material having a narrower energy band gap and a laser electron affinity than said the energy band gap and electron affinity of said first III-V compound semiconductor.

15. A quantum wire semiconductor structure according to claim 14, wherein said corresponding striped top surfaces of said base portions are of a substantially common size.

16. A quantum wire semiconductor structure comprising:

a III-V compound semiconductor substrate having a main surface defined by the (100) plane;

truncated triangular prism base portions of a first III-V compound semiconductor formed on said main surface of said substrate, each having two corresponding (111) A plane sides and a corresponding truncated top portion defining a corresponding, first stripe top surface and serving as a potential barrier;

truncated triangular prism quantum wires formed on the corresponding stripe top surfaces of respective said base portions, each having two corresponding (111) A plane sides and a corresponding truncated top portion defining a corresponding, second stripe top surface, made of a second III-V compound larger electron affinity than the energy band gap and electron affinity of said first III-V compound semiconductor; and triangular prism top portions of said first III-V compound semiconductor formed on the corresponding striped top surfaces of respective, said truncated triangular prism quantum wires, each having two corresponding (111) A plane sides and serving as a potential barrier.

17. A quantum wire semiconductor structure according to claim 16, wherein said first striped top surfaces of said base portions are of a substantially common size.

18. A method for producing a quantum wire semiconductor structure comprising the steps of:

forming an insulating layer on the main surface of a III-V compound semiconductor substrate, the main surface being defined by the (100) plane and the insulating layer having stripe openings therein exposing corresponding stripe surface portions of the main surface of the substrate;

growing triangular prisms of a first III-V compound semiconductor material, each having two corresponding (111) A plane sides; on respective, said stripe surface portions on said substrate exposed through said stripe openings;

etching triangular prism top portions of said triangular prisms thereby to form, therefrom, truncated triangular prism base portions having corresponding stripe top surfaces; and growing triangular prism quantum wires, each having two corresponding (111) A plane sides and made of a second III-V compound semiconductor material having a narrower energy band gap and a larger electron affinity than the energy band gap and electron affinity of said first III-V compound semiconductor, on the corresponding stripe top surfaces of respective, said truncated triangular prism base portions.

19. A method of producing a quantum wire semiconductor structure comprising the steps of:

forming an insulating layer on the main surface of a III-V compound semiconductor substrate, the main surface being defined by the (100) plane and the insulating layer having stripe openings therein exposing corresponding stripe surface portions of the main surface of the substrate;

growing triangular prisms of a first III-V compound semiconductor material, each having two corresponding (111) A plane sides, on respective, said stripe surface portions of substrate exposed through said stripe openings;

etching triangular prism top portions of said triangular prisms thereby to form, therefrom, truncated triangular prism base portions, each thereof serving as a potential barrier;

growing truncated triangular prism quantum wires, each having two corresponding (111) A plane sides and a corresponding truncated top portion and made of a second III-V compound semiconductor having a narrower energy band gap and a larger electron affinity than the energy band gap and electron affinity of said first III-V compound semiconductor, on the corresponding stripe top surfaces of respective, said base portions, each truncated triangular prism quantum wire having a corresponding stripe top surface;

growing triangular prism top portions of said first III-V compound semiconductor, each having two corresponding (111) A plane sides and serving as a potential barrier, on the corresponding stripe top surfaces of respective, said truncated triangular prism quantum wires.

20. A semiconductor quantum box optical element comprising:

a III-V compound semiconductor substrate having a main surface defined by the (111) B plane;

truncated triangular pyramid base portions of a first III-V compound semiconductor material, each having three corresponding (111) A plane sides and a corresponding triangular top surface, formed on said substrate;

triangular pyramid quantum boxes formed on the corresponding triangle top surfaces of respective, said truncated triangular pyramid base portions, each having three corresponding (111) A plane sides, of a second III-V compound semiconductor material having a narrower energy band gap and a larger electron affinity than the energy band gap and electron affinity of said first III-V compound semiconductor; and a covering compound semiconductor layer formed on and covering said triangular pyramid quantum boxes and said main surface of said substrate.

21. A semiconductor quantum box laser comprising:

a III-V compound semiconductor substrate having a main surface defined by the (111) B plane;

truncated triangular pyramid base portions of a first III-V compound semiconductor material, each having three corresponding (111) A plane sides and a corresponding first triangular top surface, formed on said substrate;

triangular pyramid quantum boxes formed on the corresponding triangle top surfaces of respective, said truncated triangular pyramid base portions, each having three corresponding (111) A plane sides, of a second III-V compound semiconductor material having a narrower energy band gap and a larger electron affinity than the energy band gap and electron affinity of said first III-V compound semiconductor;

a covering compound semiconductor layer formed on said corresponding three (111) A plane sides of each of said triangular pyramid quantum boxes and said main surface of said substrate and of a thickness which is less than the height of said truncated triangular pyramid base portions relative to the main surface of the substrate;

a compound semiconductor clad layer formed on said covering semiconductor layer and of a thickness so as to extend from the surface of the covering compound semiconductor layer to a height, relatively to the main surface of the substrate, which is greater than the height of the truncated triangular pyramid base portions;

a compound semiconductor cap layer formed on said clad layer; and first and second electrodes formed respectively on said cap layer and said substrate.

22. A semiconductor quantum box laser according to claim 20, wherein each of said triangular pyramid quantum boxes is truncated and defines a corresponding triangular top surface, further comprising triangular pyramid top portions, each having three corresponding (111) A plane sides, of said first III-V compound semiconductor and formed on the corresponding triangle top surfaces of respective, said quantum boxes.

23. A semiconductor quantum box laser according to claim 21, wherein the thickness of the covering compound semiconductor layer corresponds to the height of the truncated triangular pyramid base portions relatively to the main surface of the substrate and the thickness of said clad layer is selected such that said clad layer extends from the covering compound semiconductor layer to a height, relatively to the main surface of the substrate, which is greater than the height of said truncated triangular pyramid quantum boxes.

24. A semiconductor quantum box device comprising:
- a silicon semiconductor substrate having a main surface defined by the 100) plane;
- truncated quadrilateral pyramid base portions of a first, silicon semiconductor material, each having four corresponding (111) plane sides and a corresponding, square top surface, formed on said main surfaces of said substrate;
- quadrilateral pyramid quantum boxes formed on the corresponding square top surfaces of respective, said truncated quadrilateral pyramid base portions, each having four corresponding (111) plane sides, of a second semiconductor material having a narrower energy band gap and a larger electron affinity than the energy band gap and electron affinity of said silicon semiconductor; and
- a covering silicon semiconductor layer formed over and covering said quantum boxes and the main surfaces of said substrate.

* * * * *

UNITED STATES PATENT AND TRADEMARK OFFICE
CERTIFICATE OF CORRECTION

PATENT NO. : 5,313,484
DATED : May 17, 1994
INVENTOR(S) : ARIMOTO

It is certified that error appears in the above-indentified patent and that said Letters Patent is hereby corrected as shown below:

TITLE PAGE: [56] References Cited, under "OTHER PUBLICATIONS", delete the third (last) publication cited -- it is not a prior art reference.

Col. 1, line 39, after "lithography" insert --)--.

Col. 3, line 33, after "resulting" insert --,--.

Col. 5, line 47, after "width" insert --,--;
line 48, change "sur" to --surface--.

Col. 11, line 40, after "planes" insert --,--.

Col. 12, line 16, after "53" insert --,--;
line 20, change "formed. Alternatively" to --formed, alternatively--.

Col. 14, line 65, delete "gate".

* Col. 16, line 44, change "laser" to --larger--; and change "said the" to --the--.

Signed and Sealed this

Third Day of October, 1995

Attest:

BRUCE LEHMAN

*Attesting Officer*     *Commissioner of Patents and Trademarks*